United States Patent
Xue et al.

(10) Patent No.: US 10,255,935 B2
(45) Date of Patent: Apr. 9, 2019

(54) MAGNETIC TUNNEL JUNCTIONS SUITABLE FOR HIGH TEMPERATURE THERMAL PROCESSING

(71) Applicant: Applied Materials, Inc., Santa Clara, CA (US)

(72) Inventors: Lin Xue, San Jose, CA (US); Chi Hong Ching, Santa Clara, CA (US); Jaesoo Ahn, San Jose, CA (US); Mahendra Pakala, Fremont, CA (US); Rongjun Wang, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/862,301

(22) Filed: Jan. 4, 2018

(65) Prior Publication Data

US 2019/0027169 A1    Jan. 24, 2019

Related U.S. Application Data

(60) Provisional application No. 62/535,792, filed on Jul. 21, 2017.

(51) Int. Cl.
*H01L 27/20* (2006.01)
*G11B 5/39* (2006.01)
(Continued)

(52) U.S. Cl.
CPC ............ *G11B 5/3909* (2013.01); *G11B 5/313* (2013.01); *G11B 5/3932* (2013.01); *G11C 11/15* (2013.01); *H01L 21/76886* (2013.01)

(58) Field of Classification Search
CPC ..... G11B 5/3909; G11B 5/3932; G11B 5/313; G11C 11/15

(Continued)

(56) References Cited

U.S. PATENT DOCUMENTS

2004/0041183 A1    3/2004 Slaughter et al.
2013/0216702 A1*    8/2013 Kaiser ................. H01L 43/12
427/127
(Continued)

FOREIGN PATENT DOCUMENTS

KR    101739640 B1    5/2017

OTHER PUBLICATIONS

Yakushiji, K. et al., "Very strong antiferromagnetic interlayer exchange coupling with iridium spacer layer for perpendicular magnetic tunnel junctions," App. Phys. Lett. vol. 110, pp. 092406-1-092406-4, 2017.

(Continued)

*Primary Examiner* — Moin M Rahman
(74) *Attorney, Agent, or Firm* — Patterson + Sheridan, LLP

(57) ABSTRACT

Embodiments herein provide film stacks utilized to form a magnetic tunnel junction (MTJ) structure on a substrate, comprising: a buffer layer; a seed layer disposed over the buffer layer; a first pinning layer disposed over the seed layer; a synthetic ferrimagnet (SyF) coupling layer disposed over the first pinning layer; a second pinning layer disposed over the SyF coupling layer; a structure blocking layer disposed over the second pinning layer; a magnetic reference layer disposed over the structure blocking layer; a tunnel barrier layer disposed over the magnetic reference layer; a magnetic storage layer disposed over the tunnel barrier layer; a capping layer disposed over the magnetic storage layer, wherein the capping layer comprises one or more layers; and a hard mask disposed over the capping layer, wherein at least one of the capping layer, the buffer layer, and the SyF coupling layer is not fabricated from Ru.

20 Claims, 3 Drawing Sheets

(51) Int. Cl.
*G11B 5/31* (2006.01)
*G11C 11/15* (2006.01)
*H01L 21/768* (2006.01)

(58) Field of Classification Search
USPC .... 257/421, 296, 295, 368, 288; 438/102, 3, 438/666
See application file for complete search history.

(56) References Cited

U.S. PATENT DOCUMENTS

| | | |
|---|---|---|
| 2014/0145792 A1 | 5/2014 | Wang et al. |
| 2016/0087193 A1 | 3/2016 | Pinarbasi et al. |
| 2016/0163966 A1 | 6/2016 | Hu et al. |
| 2016/0181508 A1 | 6/2016 | Lee et al. |
| 2017/0170393 A1 | 6/2017 | Xue et al. |

OTHER PUBLICATIONS

Internation Search Report and Written Opinion dated Sep. 7, 2018 for Application No. PCT/US2018/033262.

\* cited by examiner

| 255 |
|---|
| 250 |
| 245 |
| 240 |
| 235 |
| 230 |
| 225 |
| 220 |
| 215/215' |
| 210/210' |
| 205/205' |
| 204 |
| 200 |

FIG. 2A

| 255 |
|---|
| 250d |
| 250c |
| 250b |
| 250x |
| 250a |
| 245c |
| 245b |
| 245a |
| 240 |
| 235 |
| 230 |
| 225b |
| 225a |
| 220 |
| 215b |
| 215a |
| 210 |
| 205b, 205c |
| 205a |
| 204 |
| 200 |

FIG. 2B

| 255 |
|---|
| 250d |
| 250c |
| 250b |
| 250x |
| 250a |
| 245c |
| 245b |
| 245a |
| 240 |
| 235 |
| 230 |
| 225b |
| 225a |
| 220 |
| 215b' |
| 215a' |
| 210' |
| 205a' |
| 205b', 205c' |
| 204 |
| 200 |

FIG. 2C

| 250d |
|------|
| 250c |
| 250b |
| 250x |
| 250a |

FIG. 3A

| 250d |
|------|
| 250c |
| 250b |
| 250a |

FIG. 3B

| 250d |
|------|
| 250c |
| 250x |
| 250a |

FIG. 3C

| 250x |
|------|
| 250a |

FIG. 3D

MAGNETIC TUNNEL JUNCTIONS SUITABLE FOR HIGH TEMPERATURE THERMAL PROCESSING

CROSS REFERENCE TO RELATED APPLICATIONS

This application claims benefit of U.S. Provisional Patent Application No. 62/535,792, filed Jul. 21, 2017, the entirety of which is herein incorporated by reference.

FIELD

Embodiments of the present disclosure relate to methods for fabricating structures used in spin-transfer-torque magnetic random access memory (STT-MRAM) applications. More specifically, embodiments of the disclosure relate to methods for fabricating magnetic tunnel junction structures for MRAM applications.

BACKGROUND

Magnetic random access memory (MRAM) is a type of memory device containing an array of MRAM cells that store data using their resistance values instead of electronic charges. Generally, each MRAM cell includes a magnetic tunnel junction (MTJ) structure. The MTJ structure typically includes a stack of magnetic layers having a configuration in which two ferromagnetic layers are separated by a thin non-magnetic dielectric, e.g., an insulating tunneling layer. A top electrode and a bottom electrode are utilized to sandwich the MTJ structure so electric current may flow between the top and the bottom electrode.

One type of MRAM cell is spin-transfer-torque magnetic random access memory (STT-MRAM). In such a fabrication process flow, a stable magnetic tunnel junction (MTJ) stack is needed to sustain high temperature backend thermal processing while still producing high tunnel magnetoresistance (TMR) ratio. MTJ stack often starts with a buffer layer to improve adhesion and the seeding of the subsequent layers. MTJ stack also includes a synthetic ferrimagnet (SyF) coupling layer to couple the first pinning layer and the second pinning layer antiparallelly. A capping layer is utilized on top of the MTJ stack that ends with a noble metal material, which protects the stack from corrosion and also acts as a etch stop layer for hard mask etching.

During manufacturing of conventional STT-MRAM devices, a thermal annealing process is often performed right after the film layer deposition process to assist crystallization of the ferromagnetic layers as well as the insulator material sandwiched in the device structure. Insufficient thermal energy or inaccurate temperature control during the annealing process may cause the film bonding structures or properties formed in an undesirable manner. For example, inaccurate temperature control or undesired drift of the thermal diffusion during the annealing process may result in insufficient crystallization of the film layer, leading to failure of the device to meet its intended performance.

Conventional methods use a Ta- and/or Ru-based buffer layer for purposes adhesion and seeding of the subsequent layers. However, the buffer layer is easy to be segregated. The texture from the bottom contact tends to affect the texture of the MTJ film stack through the buffer and becomes detrimental to TMR ratio and magnetic properties of the stack, i.e., the texture roughness is carried from the substrate/bottom contact layers to the other layers of the MTJ film stack. Ru is also used in conventional methods for fabricating SyF coupling layers and capping layers. However, Ru tends to diffuse towards the MgO based tunnel barrier layer to bond with oxygen ion. Such detrimental diffusion lowers the TMR ratio of the film stack. The effect becomes severe during thermal process at elevated temperatures.

Therefore, there is a need in the art for improved methods and apparatus for fabricating MTJ structures for STT-MRAM applications with high volume manufacturability. There is also a need for improved MTJ stacks that are able to sustain high temperature thermal processing while preserving high TMR ratio and magnetic properties such as high SyF coupling, high perpendicular magnetic anisotropy of pinned layers and reference layer, and controllable perpendicular magnetic anisotropy of free layer.

SUMMARY

Embodiments of the disclosure provide methods for fabricating magnetic tunnel junction (MTJ) structures on a substrate in MRAM applications, particularly for spin-transfer-torque magnetic random access memory (STT-MRAM) applications. Some embodiments provide compositions of film stacks for MTJ structures.

In an embodiment, a film stack utilized to form a magnetic tunnel junction (MTJ) structure on a substrate is provided. The film stack includes a buffer layer; a seed layer disposed over the buffer layer; a first pinning layer disposed over the seed layer; a synthetic ferrimagnet (SyF) coupling layer disposed over the first pinning layer; a second pinning layer disposed over the SyF coupling layer; a structure blocking layer disposed over the second pinning layer; a magnetic reference layer disposed over the structure blocking layer; a tunnel barrier layer disposed over the magnetic reference layer; a magnetic storage layer disposed over the tunnel barrier layer; a capping layer disposed over the magnetic storage layer, wherein the capping layer comprises one or more layers; and a hard mask disposed over the capping layer, wherein at least one of the capping layer, the buffer layer, and the SyF coupling layer is not fabricated from Ru.

In another embodiment, a film stack utilized to form a magnetic tunnel junction (MTJ) structure on a substrate is provided is provided. The film stack includes a buffer layer, wherein the buffer layer comprises a CoFeB containing layer; seed layer disposed over the buffer layer; a first pinning layer disposed over the seed layer; a synthetic ferrimagnet (SyF) coupling layer disposed over the first pinning layer, wherein the SyF coupling layer comprises an Ir containing layer; a second pinning layer disposed over the SyF coupling layer; a structure blocking layer disposed over the second pinning layer; a magnetic reference layer disposed over the structure blocking layer; a tunnel barrier layer disposed over the magnetic reference layer; a magnetic storage layer disposed over the tunnel barrier layer; a capping layer disposed over the magnetic storage layer, wherein the capping layer comprises one or more layers; and a hard mask disposed over the capping layer, wherein at least one of the capping layer, the buffer layer, and the SyF coupling layer is not fabricated from Ru.

In another embodiment, a film stack utilized to form a magnetic tunnel junction (MTJ) structure on a substrate is provided is provided. The film stack includes a buffer layer, wherein the buffer layer comprises a CoFeB containing layer, wherein the wt % of boron is greater than about 20%; a seed layer disposed over the buffer layer; a first pinning layer disposed over the seed layer; a synthetic ferrimagnet (SyF) coupling layer disposed over the first pinning layer, wherein the SyF coupling layer comprises an Ir containing layer; a second pinning layer disposed over the SyF coupling layer; a structure blocking layer disposed over the second pinning layer; a magnetic reference layer disposed over the structure blocking layer; a tunnel barrier layer disposed over the magnetic reference layer; a magnetic storage layer disposed over the tunnel barrier layer; a capping layer disposed over the magnetic storage layer, wherein the capping layer comprises one or more layers, and a top layer of the capping layer is an Ir containing layer; and a hard mask disposed over the capping layer, wherein at least one of the capping layer, the buffer layer, and the SyF coupling layer is not fabricated from Ru.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2A shows a schematic diagram of a portion of a film stack, according to some embodiments.

FIG. 2B shows a schematic diagram of a portion of the film stack, according to some embodiments.

FIG. 2C shows a schematic diagram of a portion of the film stack, according to some embodiments.

FIG. 3A shows a schematic diagram of a capping layer, according to some embodiments.

FIG. 3B shows a schematic diagram of a capping layer, according to some embodiments.

FIG. 3C shows a schematic diagram of a capping layer, according to some embodiments.

FIG. 3D shows a schematic diagram of a capping layer, according to some embodiments.

Figure 1:
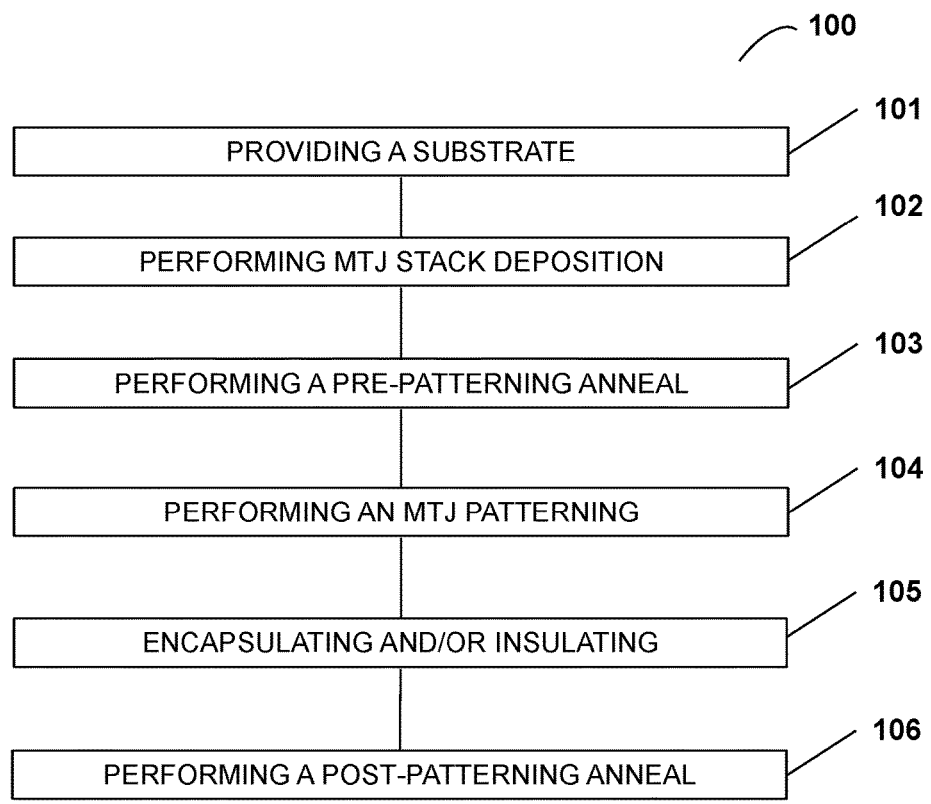
FIG. 1 depicts a flow diagram illustrating a method for fabricating magnetic tunnel junction (MTJ) structures, according to some embodiments.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure generally provide apparatus and methods for forming MTJ structures from a film stack disposed on a substrate for MRAM applications. The apparatus and methods include forming the film properties of material layers from the film stack with desired crystallinity by a thermal process performed after the patterning of the material layers in the film stack. While patterning, a sidewall passivation layer may be formed along sidewalls of the film stack. Thus, by performing the thermal process after the patterning process and the sidewall passivation deposition process, the thermal energy provided from the thermal process may efficiency diffuse dopants into the material layers laterally outward toward the sidewall passivation layer, rather than vertically to adjacent material layers formed in the film stack. By doing so, a controllable degree of crystallinity of the material layers in the film stack may be obtained without damage or interference from the dopants that might potentially be cross-diffused from the adjacent materials. The film stack as patterned and annealed with desired degree of crystallinity may be used to form MTJ structures with desired dimension and features for MRAM applications.

FIG. 1 depicts a flow diagram illustrating a process 100 for manufacturing MTJ structures on a substrate for MRAM applications according to one embodiment of the present disclosure. In some embodiments, process 100 is a process flow, and operations 101-106 are individual processes. The process 100 is configured to be performed in a plasma processing chamber and a thermal processing chamber or other suitable plasma immersion ion implantation systems or etching chamber, including those from other manufacturers. Process 100 may also use other tools such as a PVD chamber, CVD chamber, lithography tool.

The process 100 begins at operation 101 by providing a substrate having a film stack disposed thereon. In some embodiments, the substrate includes metal or glass, silicon, dielectric bulk material and metal alloys or composite glass, crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate may have various dimensions, such as about 200 mm, about 300 mm, about 450 mm or other diameter, as well as, being a rectangular or square panel. Unless otherwise noted, examples described herein are conducted on substrates with a 200 mm diameter, a 300 mm diameter, or a 450 mm diameter substrate. In one embodiment, the substrate includes the film stack disposed on the substrate.

It is noted that pinned magnetic layer(s), optional structure decoupling layer(s), tunnel barrier layer(s), magnetic storage layer(s), magnetic reference layer(s), and capping layer(s) may be formed by any suitable techniques and any suitable manners, such as PVD processes. Examples of systems that may be used to form these layers include ENDURA® PVD system available from Applied Materials Inc., Santa Clara, Calif. It is contemplated that other processing system, including those available from other manufacturers, may be adapted to practice the disclosure.

Prior to performing MTJ stack deposition at operation 102, there may be some other processes to form transistor and interconnect layers, known to those of skill in the art. After performing a post-patterning anneal at operation 106, additional operations may be performed, such as operations to complete remaining interconnect layers and contact pads.

At operations 102-104, MTJ stack deposition, pre-patterning anneal, and MTJ patterning is performed. These operations include a patterning process, e.g., an etching process, performed to remove a portion of the film stack exposed and defined by an etching mask layer (not shown) from the substrate until the underlying substrate is exposed. The patterning process for patterning the film stack may include several steps or different recipes configured to supply different gas mixtures or etchants to etch different layers in accordance with the materials included in each layer. During patterning, an etching gas mixture or several gas mixtures with different etching species are sequentially supplied into the substrate surface to remove the portion of the film stack from the substrate. The end point of the patterning process at operation 104 may be controlled by time or other suitable methods. For example, the patterning process may be terminated after performing for between about 200 seconds and about 10 minutes until the substrate is exposed. The patterning process may be terminated by determination from an endpoint detector, such as an OES detector or other suitable detector as needed.

A further deposition process may be performed to form an encapsulation and insulation layer on the portion of the substrate where the film stack was removed during the patterning process at operation 104. Encapsulation allows for good step coverage and hermeticity, and is often composed of silicon nitride based materials. Insulation is often composed of oxide based materials, and typically much thicker than encapsulation. The insulation layer may be any suitable insulating materials that may later under series of etching and deposition processes to form interconnection structure (e.g., a backend process) in the insulation layer to complete the device structure fabrication process. In one example, the insulation layer is a silicon oxide layer or other suitable material.

At operation 106, a thermal annealing process is performed. One example of a system that may be used for annealing includes rapid thermal anneal chambers available from Applied Materials Inc., Santa Clara, Calif. It is contemplated that other processing system, including those available from other manufacturers, may be adapted to practice the disclosure. The thermal annealing process is performed to repair, densify and enhance lattice structures of the film stack, particularly the magnetic storage layer(s) and the magnetic reference layer(s) included in the film stack. After the thermal annealing process, the magnetic storage layer(s) and magnetic reference layer(s) may be turned into a crystallized magnetic storage layer(s) and crystallized magnetic reference layer(s), having crystal orientation mostly in one plane. As desired crystallization of the magnetic storage layer(s) and the magnetic reference layer(s) is obtained, the overall electrical properties of the film stack for manufacturing MTJ devices are improved.

In some embodiments, one of operations 103 and 106 (or any other equivalent anneal process) can be used, depending on applications.

As described below, the MTJ film stacks of the present disclosure are capable of sustaining high temperature thermal processes and improved electrical and magnetic properties.

Each of FIGS. 2A-2C individually show a schematic diagram of a portion of the film stack, according to some embodiments. 200 is a substrate. 204 is a bottom electrode, which is patterned in some embodiments. Although not depicted in FIGS. 2A-2C, other layers such as transistor and interconnect structures in the form of one or more layers may be disposed between substrate 200 and bottom contact 204 according to some embodiments. Differences between film stacks illustrated in FIG. 2B and FIG. 2C include the buffer layer 205/205', seed layer 210/210', and first pinning layer 215/215'. In some embodiments, a film stack includes one or more of a bottom contact, a buffer layer, a seed layer, a first pinning layer, a synthetic ferrimagnet (SyF) coupling layer, a second pinning layer, a structure blocking layer, a magnetic reference layer, a tunnel barrier layer, a magnetic storage layer, a capping layer, and a hard mask. In some embodiments, each of these layers individually comprises one or more layers.

In some embodiments, and as shown in FIG. 2A-2C, the film stack utilized to form a magnetic tunnel junction (MTJ) structure is disposed over a bottom contact 204. The MTJ structure includes a buffer layer 205/205' disposed over the bottom contact 204; a seed layer 210/210' disposed over the buffer layer 205/205'; a first pinning layer 215/215' disposed over the seed layer 210/210'; a synthetic ferrimagnet (SyF) coupling layer 220 disposed over the first pinning layer 215/215'; a second pinning layer 225 disposed over the SyF coupling layer 220; a structure blocking layer 230 disposed over the second pinning layer 225; a magnetic reference layer 235 disposed over the structure blocking layer 230; a tunnel barrier layer 240 disposed over the magnetic reference layer 235; a magnetic storage layer 245 disposed over the tunnel barrier layer 240; a capping layer 250 disposed over the magnetic storage layer 245, wherein the capping layer includes one or more layers; and a hard mask 255 disposed over the capping layer 250, wherein at least one of the capping layer, the buffer layer, and the SyF coupling layer is not fabricated from Ru.

The film stack includes a buffer layer 205/205' disposed over a bottom contact 204. The buffer layer 205/205' may be sandwiched between bottom contact 204 and seed layer 210/210'. MTJ film stacks often start with a buffer layer to improve adhesion and the seeding of the subsequent layers. In some embodiments, buffer layer 205/205' includes one or more layers. In some embodiments, the buffer layer is not fabricated from Ru.

In some embodiments, the buffer layer includes a CoFeB containing layer 205a/205a'. The weight % (wt %) of boron (B) in the buffer layer cis between about 10 wt % and about 40 wt %, preferably between about 20 wt % and 40 wt %, more preferably between about 25 wt % and about 40 wt %. The wt % of iron in the buffer layer is between about 20 wt % and about 60 wt %, preferably between about 40 wt % and 60 wt %, more preferably between about 45 wt % and about 60 wt %. The thickness of the CoFeB containing layer 205a/205a' is between about 0 Å and about 20 Å, preferably about 10 Å.

In some embodiments, the buffer layer 205/205' may comprise a TaN containing layer 205b/205b' and/or a Ta containing layer 205c/205c'. The TaN containing layer 205b/205b' and the Ta containing layer 205c/205c' may be disposed over the CoFeB layer. Alternately, the TaN containing layer 205b/205b' and the Ta containing layer 205c/205c' may be disposed under the CoFeB layer. The thickness of the TaN containing layer and the Ta containing layer is between about 0 Å and about 40 Å, preferably about 15 Å.

The film stack includes a seed layer 210/210' disposed over the buffer layer 205/205'. The seed layer 210/210' may be sandwiched between the buffer layer 205/205' and first pinning layer 215/215'.

In some embodiments, seed layer 210 includes one or more of a Pt containing layer, an Ir containing layer, and a Ru containing layer. The thickness of seed layer 210 having one or more of Pt containing layer, an Ir containing layer, and a Ru containing layer is between about 0 Å and about 60 Å, preferably about 25 Å. In some embodiments, when the seed layer 210 includes one or more of a Pt containing layer, an Ir containing layer, and a Ru containing layer, the CoFeB containing layer 205a of the buffer layer is disposed under the TaN containing layer 205b (and/or Ta containing layer 205c) of the buffer layer.

In some embodiments, seed layer 210' includes a NiCr containing layer. The thickness of seed layer 210' having a NiCr containing layer is between about 0 Å and about 100 Å, preferably about 50 Å. In some embodiments, when the seed layer includes a NiCr containing layer, the CoFeB containing layer 205a' of the buffer layer is disposed over the TaN containing layer 205b' (and/or Ta containing layer 205c') of the buffer layer.

In some embodiments, the film stack includes a first pinning layer 215/215' disposed over seed layer 210/210'. The first pinning layer 215/215' may be sandwiched between seed layer 210/210' and SyF coupling layer 220. The first pinning layer 215/215' may comprise one or more layers. The first pinning layer may be constructed of several magnetic materials such as a metal alloy with dopants, such as boron dopants, oxygen dopants or other suitable materials. Metal alloys may include a Ni containing material, a Pt containing material, a Ru containing material, a Co containing material, a Ta containing material, and Pd containing materials. Suitable examples of the magnetic materials include Ru, Ta, Co, Pt, Ni, TaN, NiFeO$_x$, NiFeB, CoFeO$_x$B, CoFeB, CoFe, NiO$_x$B, CoBO$_x$, FeBO$_x$, CoFeNiB, CoPt, CoPd, CoNi, and TaO$_x$.

In some embodiments, first pinning layer 215 includes a Co containing layer 215b disposed over a Co/Pt containing layer 215a. The thickness of the Co containing layer 215b is between about 0 Å and about 10 Å, preferably about 5 Å. The Co/Pt containing layer 215a may have a composition comprising $$[Co_{(x)}/Pt_{(y)}]_m$$

wherein x has a thickness of Co between about 0 Å and about 10 Å, preferably between about 0.5 Å and about 7 Å, y has a thickness of Pt between about 0 Å and about 10 Å, preferably between about 0.5 Å and about 8 Å, and m is an integer between about 3 and about 10, wherein m represents the number of Co/Pt containing layers 215a repeatedly formed in the film stack. For example, when x is 5 Å, y is 3 Å, and m is integer 2, it represents a Co/Pt layer of Co layer (5 Å)/Pt layer (3 Å)/Co layer (5 Å)/Pt layer (3 Å).

In some embodiments, first pinning layer 215' includes a Co containing layer 215b' disposed over a Co/Ni containing layer 215a'. The thickness of the Co containing layer 215b is between about 0 Å and about 10 Å, preferably about 5 Å. The Co/Ni containing layer 215a' may have a composition comprising $$[Co_{(x1)}/Ni_{(y1)}]_n$$

wherein x1 has a thickness of Co between about 0 Å and about 10 Å, preferably between about 1 Å and about 8 Å, y1 has a thickness of Ni between about 0 Å and about 10 Å, preferably between about 1 Å and about 8 Å, and n is an integer between about 1 and about 10, where n represents the number of Co/Ni containing layers 215a' repeatedly formed in the film stack.

In some embodiments, when the first pinning layer 215 includes Co/Pt containing layer 215a, the seed layer 210 includes one or more of a Pt containing layer, an Ir containing layer, and a Ru containing layer.

In some embodiments, when the first pinning layer 215' includes a Co/Ni containing layer 215a', the seed layer 210 includes a NiCr containing layer.

The film stack includes a synthetic ferrimagnet (SyF) coupling layer 220 disposed over the first pinning layer 215/215'. In some embodiments, the SyF coupling layer 220 is sandwiched between first pinning layer 215/215' and second pinning layer 225. The SyF coupling layer 220 is used to couple the first pinning layer and the second pinning layer antiparallely. In some embodiments, the SyF coupling layer 220 includes one or more of an Ir containing layer, a Ru containing layer, a Rh containing layer, and a Cr containing layer. Preferably the SyF coupling layer is an Ir containing layer. Preferably, the SyF coupling layer is not fabricated from Ru. The thickness of SyF coupling layer 220 is between about 3 Å and about 10 Å. When the SyF coupling layer is a Ru containing layer, the thickness of the layer is preferably between about 4 Å and about 5 Å or between about 7 Å and about 9 Å. When the SyF coupling layer is an Ir containing layer, the thickness of the layer is preferably between about 4 Å and about 6 Å.

The film stack includes a second pinning layer 225 disposed over SyF coupling layer 220. In some embodiments, the second pinning layer 225 is sandwiched between SyF coupling layer 220 and structure blocking layer 230. The second pinning layer 225 may comprise one or more layers. The second pinning layer may be constructed of several magnetic materials such as a metal alloy with dopants, such as boron dopants, oxygen dopants or other suitable materials. Metal alloys may include a Ni containing material, a Pt containing material, a Ru containing material, a Co containing material, a Ta containing material, and Pd containing materials. Suitable examples of the magnetic materials include Ru, Ta, Co, Pt, Ni, TaN, NiFeO$_x$, NiFeB, CoFeO$_x$B, CoFeB, CoFe, NiO$_x$B, CoBO$_x$, FeBO$_x$, CoFeNiB, CoPt, CoPd, CoNi, and TaO$_x$.

In some embodiments, second pinning layer 225 includes a Co containing layer 225b disposed over a Co/Pt containing layer 215a. The thickness of the Co containing layer 225b is between about 0 Å and about 10 Å, preferably about 5 Å. The Co/Pt containing layer 215a may have a composition comprising $$[Co_{(x2)}/Pt_{(y2)}]_p$$

wherein x2 has a thickness of Co between about 0 Å and about 10 Å, preferably between about 0.5 Å and about 7 Å, y2 has a thickness of Pt between about 0 Å and about 10 Å, preferably between about 0.5 Å and about 8 Å, and p is an integer between about 0 and about 5, where p represents the number of Co/Pt containing layers 225a repeatedly formed in the film stack.

The film stack includes structure blocking layer 230 disposed over second pinning layer 225. In some embodiments, structure blocking layer 230 is sandwiched between second pinning layer 225 and magnetic reference layer 235. In some embodiments, structure blocking layer 230 includes one or more layers. In some embodiments, the structure blocking layer 230 includes one or more of a metal containing material or a magnetic material, such as Mo, Ta, W, CoFe, and CoFeB, preferably one or more of a Ta containing layer, a Mo containing layer, and a W containing layer. The thickness of second pinning layer 225 is between about 0 Å and about 8 Å, preferably about 4 Å.

The film stack includes a magnetic reference layer 235 disposed over a structure blocking layer 230. In some embodiments, magnetic reference layer 235 is sandwiched between structure blocking layer 230 and tunnel barrier layer 240. In some embodiments, the magnetic reference layer 235 comprises one or more layers. Magnetic reference layer 235 may be constructed of several magnetic materials such as a metal alloy with dopants, such as boron dopants, oxygen dopants or other suitable materials. Metal alloys may include a Ni containing material, a Pt containing material, a Ru containing material, a Co containing material, a Ta containing material, and Pd containing materials. Suitable examples of the magnetic materials include Ru, Ta, Co, Pt, Ni, TaN, NiFeO$_x$, NiFeB, CoFeO$_x$B, CoFeB, CoFe, NiO$_x$B, CoBO$_x$, FeBO$_x$, CoFeNiB, CoPt, CoPd, CoNi, and TaO$_x$.

In some embodiments, one or more of the layers of the magnetic reference layer 235 includes a CoFeB containing layer. The weight % (wt %) of boron (B) in the magnetic reference layer is between about 10 wt % and about 40 wt %, preferably between about 20 wt % and 40 wt %, more preferably between about 25 wt % and about 40 wt %. The wt % of iron in the magnetic reference layer is between about 20 wt % and 60 wt %, preferably between about 40 wt % and 60 wt %, more preferably between about 45 wt % and about 60 wt %. The thickness of the magnetic reference layer 235 is between about 5 Å and about 20 Å, preferably about 10 Å.

In some embodiments, the film stack includes a tunnel barrier layer 240 disposed over magnetic reference layer 235. In some embodiments, tunnel barrier layer 240 is sandwiched between magnetic reference layer 235 and magnetic storage layer 245. Tunnel barrier layer 240 may be an oxide barrier layer. The tunnel barrier layer 240 may include $MgO$, $HfO_2$, $TiO_2$, $TaO_x$, $Al_2O_3$, or other suitable materials. In some embodiments, the tunnel barrier layer 240 may comprise MgO having a thickness of between about 1 Å and about 15 Å, preferably about 10 Å. The tunnel barrier layer 240 may be annealed either during or post deposition, for example, using a rapid thermal anneal (RTP) process.

In some embodiments, the film stack includes a magnetic storage layer 245 disposed over tunnel barrier layer 240. In some embodiments, magnetic storage layer 245 is sandwiched between tunnel barrier layer 240 and capping layer 250. The magnetic storage layer 245 may be constructed of several magnetic materials such as a metal alloy with dopants, such as boron dopants, oxygen dopants or other suitable materials. Metal alloys may include a Ni containing material, a Pt containing material, a Ru containing material, a Co containing material, a Ta containing material, and/or Pd containing materials. Suitable examples of the magnetic materials include Ru, Ta, Co, Pt, Ni, TaN, $NiFeO_x$, NiFeB, $CoFeO_xB$, CoFeB, CoFe, $NiO_xB$, $CoBO_x$, $FeBO_x$, CoFeNiB, CoPt, CoPd, CoNi, and $TaO_x$.

In some embodiments, magnetic storage layer 245 may be a CoFeB, CoFeNiB, Ta, Mo or W, combinations thereof or other suitable layer(s). For example, in the embodiment depicted in FIG. 2, the magnetic storage layer 245 includes a first CoFeB containing layer 245a and a second CoFeB containing layer 245c sandwiching an intermediate layer 245b. The first CoFeB containing layer 245a may have a thickness of about 5 Å to about 20 Å, preferably about 10 Å. The weight % (wt %) of boron (B) in the first CoFeB containing layer 245a is between about 10 wt % and about 40 wt %, preferably between about 20 wt % and 40 wt %, more preferably between about 25 wt % and about 40 wt %. The wt % of iron in the first CoFeB containing layer 245a is between about 20 wt % and about 60 wt %, preferably between about 40 wt % and 60 wt %, more preferably between about 45 wt % and 60 wt %.

The second CoFeB containing layer 245c may have a thickness of about 5 Å to about 20 Å, preferably about 10 Å. The weight % (wt %) of boron (B) in the second CoFeB containing layer 245c is between about 10 wt % and about 40 wt %, preferably between about 20 wt % and 40 wt %, more preferably between about 25 wt % and about 40 wt %. The wt % of iron in the second CoFeB containing layer 245a is between about 20 wt % and about 60 wt %, preferably between about 40 wt % and 60 wt %, more preferably between about 45 wt % and 60 wt %.

The intermediate layer 245b of the magnetic storage layer 245 may include one or more layers of at least one or more of a Ta containing layer, a Mo containing layer, and a W containing layer. The intermediate layer 245b may have a thickness of about 0 Å to about 8 Å, for example about 3 Å.

The film stack includes capping layer 250 disposed over magnetic storage layer 245. In some embodiments, capping layer 250 is sandwiched between magnetic storage layer 245 and hard mask 255. A capping layer is utilized on top of the MTJ stack that ends with a noble metal material, which protects the stack from corrosion and also acts as a etch stop layer for hard mask etching. In some embodiments, capping layer 250 includes one or more layers.

In some embodiments, the capping layer 250 includes a first layer 250a, a second layer 250b, a third layer 250c, and a fourth layer 250d.

The first layer 250a may include one or more layers of oxygen containing layers such as MgO or other suitable materials. Preferably, the oxygen containing layer is MgO. The first layer 250a may have a thickness of between about 0 Å to about 15 Å, for example about 7 Å. The second layer 250b may include one or more layers of CoFeB. The second layer 250b may have a thickness of between about 0 Å to about 50 Å, for example about 8 Å. The weight % (wt %) of boron (B) of second layer 250b is between about 10 wt % and about 40 wt %, preferably between about 20 wt % and 40 wt %, more preferably between about 25 wt % and about 40 wt %. The wt % of iron in second layer 250b is between about 20 wt % and about 60 wt %, preferably between about 40 wt % and 60 wt %, more preferably between about 45 wt % and about 60 wt %.

The third layer 250c may include one or more layers of a Ta containing material. The third layer 250c may have a thickness of between about 0 Å to about 30 Å, for example about 10 Å. The fourth layer 250d may include one or more of an Ir containing layer and a Ru containing layer, preferably one or more of an Ir containing layer. The fourth layer 250d may have a thickness of between about 0 Å to about 50 Å, for example about 30 Å.

In some embodiments, the one or more layers of capping layer 250 include one or more layers of an Ir containing layer, one or more layers of a Ru containing layer, or a combination thereof.

In some embodiments, the one or more layers of capping layer 250 include one or more of an Ir containing layer, a Ru containing layer, a Ta containing layer, a CoFeB containing layer, an Mo containing layer, a W containing layer, and a oxygen containing layer (for example, MgO). Preferably an Ir containing layer or an Ru containing layer (more preferably an Ir containing layer) is the top layer of the capping layer as the hard mask etch stop. In some embodiments, the capping layer is not fabricated from Ru.

In some embodiments, the capping layer includes an optional layer 250x. Optional layer may be disposed between the first layer 250a and the second layer 250b. The optional layer 250x, may include one or more layers of a Ir containing layer and/or a Ru containing layer, preferably Ir. Optional layer 250x may have a thickness of between about 0 Å to about 30 Å, for example about 20 Å.

In some embodiments, when the capping layer 250 includes optional layer 250x, second layer 250b is not used. In such an embodiment, optional layer 250x is above first layer 250a. In some embodiments, optional layer 250x is disposed directly above first layer 250a. In some embodiments, additional layers may be disposed above 250x.

In some embodiments, the capping layer comprises optional layer 250x and first layer 250a. In this embodiment, for example, the capping layer would be an Ir and/or Ru containing layer and an oxygen containing layer, with the Ir and/or Ru containing layer above the oxygen containing layer. In other embodiments, the capping layer includes optional layer 250x, first layer 250a, and one or more of second layer 250b, third layer 250c, and fourth layer 250d, where optional layer 250x is disposed directly above oxygen containing layer 250a.

FIGS. 3A-3D illustrates various, nonexclusive embodiments of the capping layer 250 as discussed above.

For example in FIG. 3A, capping layer 250 includes a first layer 250a; an optional layer 250x disposed above the first layer 250a; a second layer 250b disposed above the optional layer 250x; a third layer 250c disposed above the second layer 250b; and a fourth layer 250d disposed above the third layer 250c. Materials, compositions, and thickness ranges for each of these layers are discussed above.

In the example of FIG. 3B, capping layer 250 includes a first layer 250a; a second layer 250b disposed above the first layer 250a; a third layer 250c disposed above the second layer 250b; and a fourth layer 250d disposed above the third layer 250c. Materials, compositions, and thickness ranges for each of these layers are discussed above.

In the example of FIG. 3C, capping layer 250 includes a first layer 250a; an optional layer 250x disposed above the first layer 250a; a third layer 250c disposed above the optional layer 250x; and a fourth layer 250d disposed above the third layer 250c. Materials, compositions, and thickness ranges for each of these layers are discussed above.

In the example of FIG. 3C, capping layer 250 includes a first layer 250a; and an optional layer 250x disposed above the first layer 250a. Materials, compositions, and thickness ranges for each of these layers are discussed above.

FIGS. 2A-2C illustrate exemplary MTJ film stacks wherein one or more of the buffer layer, the SyF coupling layer, and the capping layer is not fabricated from Ru. In some embodiments, the MTJ film stack includes a CoFeB based buffer layer 205/205', which optionally may contain some TaN and/or Ta. The CoFeB layer may be disposed over or under a layer containing TaN and/or Ta. The wt % of boron of the CoFeB based buffer layer should be greater than about 10 wt %, preferably greater than about 25 wt %. In some embodiments, Ir, Ru, Rh, and/or Cr may be used as a SyF coupling layer 220, preferably Ir is the SyF coupling layer. In some embodiments, Ir and/or Ru may be the top layer metal for a capping layer 250. Ir is preferred as the top layer metal for a capping layer 250.

Use of a CoFeB based buffer layer in place of a Ru containing buffer layer has demonstrated an increase in the tunnel magnetoresistance (TMR) with excellent magnetic pinning even after annealing at temperatures up to 450° C. High SyF coupling, high perpendicular magnetic anisotropy of pinned layers and reference layer, and controllable perpendicular magnetic anisotropy of free layer are achieved. Some embodiments implementing a CoFeB buffer layer (with boron at 25 wt %) show a TMR (%) improvement of more than 10% from conventional Ta/Ru/Ta buffer layer. The CoFeB layer blocks increased roughness from carrying from the bottom contact into the MTJ film stack.

Additionally, replacing Ru with Ir in the SyF coupling layer and capping layer also has demonstrated an increase in the TMR (%) even after annealing at temperatures up to 450° C. Some embodiments implementing an Ir containing SyF coupling layer show a TMR (%) improvement of more than 10% from conventional Ru containing SyF coupling layer. Moreover, by eliminating Ru in the SyF coupling layer and the capping layer, the film TMR is enhanced by eliminating Ru diffusion towards the MgO. It is likely that the higher thermal stability of $IrO_2$ than $RuO_4$ plays a role in eliminating diffusion.

Configurations such as those of FIGS. 2A-2C provide advantages over conventional film stacks. The first advantage is the buffer stays amorphous even with high temperature thermal process and blocks the texture from the bottom contact. The second advantage is the strong antiparallel coupling between the pinning layers brought by Ir. The third advantage is the TMR improvement by using the new buffer layer and removing Ru from the stack. These advantages lead to higher MTJ performance (such as high TMR, high SyF coupling, high perpendicular magnetic anisotropy of pinned layers and reference layer, and controllable perpendicular magnetic anisotropy of free layer) and improved manufacturability. The MTJ film stack can be used to fabricate memory cells for STT-MRAM application as well as other memory and logic devices that use MTJs as the unit building block. Physical vapor deposition systems (such as ENDURA® STT MRAM) can be used to deposit the MTJ film stack for high performance STT-MRAM chips. As described herein, the MTJ film stack capable of sustaining high temperature thermal process improves both electrical and magnetic properties of the MTJs.

Table 1 and Table 2 show exemplary compositions for film stacks utilized to form a magnetic tunnel junction (MTJ) structure on a substrate. Materials, compositions, and thicknesses for hard mask layer and bottom contact layer are known to persons of ordinary skill in the art.

An additional (and optional) Ir and/or Ru layer within the capping layer, as described above (represented by 250x), may be placed on top of the oxygen containing layer. The thickness of this layer may be between about 0 Å to about 30 Å. In some embodiments, the CoFeB layer of the capping layer is not used when the additional Ir and/or Ru layer is used.

TABLE 1

| Layer | Material | Composition | Thickness (Å) |
|---|---|---|---|
| Hard mask | — | — | — |
| Capping layer | Ir and/or Ru | — | 0-50 |
|  | Ta | — | 0-30 |
|  | CoFeB | B: 10-40%, Fe: 20-60% | 0-50 |
|  | Ir and/or Ru | — | 0-30 |
|  | MgO | — | 0-15 |
| Magnetic storage layer | CoFeB | B: 10-40%, Fe: 20-60% | 5-20 |
|  | Ta, Mo, and/or W | — | 0-8 |
|  | CoFeB | B: 10-40%, Fe: 20-60% | 5-20 |
| Tunnel barrier layer | MgO | — | 1-15 |
| Magnetic reference layer | CoFeB | B: 10-40%, Fe: 20-60% | 5-20 |
| Structure blocking layer | Ta, Mo, and/or W | — | 0-8 |
| Second pinning layer | Co | — | 0-10 |
|  | $[Co/Pt]_p$ | p: 0-5 | Co: 0.5-7; Pt: 0.5-8 |
| SyF coupling layer | Ir or Ru | — | 3-10 |
| First pinning layer | Co | — | 0-10 |
|  | $[Co/Pt]_m$ | m: 3-10 | Co: 0.5-7; Pt: 0.5-8 |
| Seed layer | Pt, Ir, and/or Ru | 0-60 |  |
| Buffer layer | TaN and/or Ta | — | 0-40 |
|  | CoFeB | B: 10-40%, Fe: 20-60% | 0-20 |
| Bottom contact | — | — | — |

All values for composition and thickness are listed as approximate ranges.

TABLE 2

| Layer | Material | Composition (wt %) | Thickness (Å) |
|---|---|---|---|
| Capping layer | Ir and/or Ru | — | 0-50 |
| | Ta | — | 0-30 |
| | CoFeB | B: 10-40%, Fe: 20-60% | 0-50 |
| | Ir and/or Ru | — | 0-30 |
| | MgO | — | 0-15 |
| Magnetic storage layer | CoFeB | B: 10-40%, Fe: 20-60% | 5-20 |
| | Ta, Mo, and/or W | — | 0-8 |
| | CoFeB | B: 10-40%, Fe: 20-60% | 5-20 |
| Tunnel barrier layer | MgO | — | 1-15 |
| Magnetic reference layer | CoFeB | B: 10-40%, Fe: 20-60% | 5-20 |
| Structure blocking layer | Ta, Mo, and/or W | — | 0-8 |
| Second pinning layer | Co | — | 0-10 |
| | $[Co/Pt]_p$ | p: 0-5 | Co: 0.5-7; Pt: 0.5-8 |
| SyF coupling layer | Ir or Ru | — | 3-10 |
| First pinning layer | Co | — | 0-10 |
| | $[Co/Ni]_m$ | n: 1-10 | Co: 1-8; Ni: 1-8 |
| Seed layer | NiCr | — | 0-100 |
| Buffer layer | CoFeB | B: 10-40%, Fe: 20-60% | 0-20 |
| | TaN and/or Ta | — | 0-40 |

All values for composition and thickness are listed as approximate ranges.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A film stack utilized to form a magnetic tunnel junction (MTJ) structure on a substrate, comprising:
    a buffer layer;
    a seed layer disposed over the buffer layer;
    a first pinning layer disposed over the seed layer;
    a synthetic ferrimagnet (SyF) coupling layer disposed over the first pinning layer;
    a second pinning layer disposed over the SyF coupling layer;
    a structure blocking layer disposed over the second pinning layer;
    a magnetic reference layer disposed over the structure blocking layer;
    a tunnel barrier layer disposed over the magnetic reference layer;
    a magnetic storage layer disposed over the tunnel barrier layer;
    a capping layer disposed over the magnetic storage layer, wherein the capping layer comprises one or more layers; and
    a hard mask disposed over the capping layer, wherein at least one of the capping layer, the buffer layer, and the SyF coupling layer is not fabricated from Ru.

2. The film stack of claim 1, wherein the capping layer comprises one or more of an Ir containing layer, a Ru containing layer, or a combination thereof.

3. The film stack of claim 2, wherein the capping layer further comprises:
    an oxygen containing layer.

4. The film stack of claim 3, wherein the capping layer further comprises:
    a CoFeB containing layer.

5. The film stack of claim 3, wherein the capping layer further comprises:
    a Ta containing layer.

6. The film stack of claim 1, wherein the capping layer comprises:
    an Ir containing layer, a Ru containing layer, or a combination thereof as a top layer; and
    an oxygen containing layer, wherein the top layer is disposed directly above the oxygen containing layer.

7. The film stack of claim 1, wherein the capping layer comprises:
    an Ir containing layer as a top layer; and
    one or more of a W containing layer, an oxygen containing layer, a second Ir containing layer disposed directly above the oxygen containing layer, a CoFeB containing layer, a Ta containing layer, and a Mo containing layer.

8. The film stack of claim 1, wherein the SyF coupling layer comprises:
    an Ir containing layer.

9. The film stack of claim 1, wherein the buffer layer comprises:
    a CoFeB containing layer.

10. The film stack of claim 9, wherein a wt % of boron in the buffer layer is between about 20 wt % and 40 wt %.

11. The film stack of claim 1, wherein the seed layer comprises:
    (a) a NiCr containing layer, or (b) one or more of a Pt containing layer, an Ir containing layer, and a Ru containing layer.

12. The film stack of claim 9, wherein:
    the seed layer comprises a NiCr containing layer; and
    the buffer layer further comprises one or more of a TaN containing layer and a Ta containing layer, wherein the CoFeB containing layer of the buffer layer is disposed over one or more of the TaN containing layer of the buffer layer and the Ta containing layer of the buffer layer.

13. The film stack of claim 9, wherein
    the seed layer comprises one or more of a Pt containing layer, an Ir containing layer, and a Ru containing layer; and
    the buffer layer further comprises one or more of a TaN containing layer and a Ta containing layer, wherein the CoFeB containing layer of the buffer layer is disposed under one or more of the TaN containing layer of the buffer layer and the Ta containing layer of the buffer layer.

14. A film stack utilized to form a magnetic tunnel junction (MTJ) structure on a substrate, comprising:
    a buffer layer, wherein the buffer layer comprises a CoFeB containing layer;
    a seed layer disposed over the buffer layer;
    a first pinning layer disposed over the seed layer;
    a synthetic ferrimagnet (SyF) coupling layer disposed over the first pinning layer, wherein the SyF coupling layer comprises an Ir containing layer;
    a second pinning layer disposed over the SyF coupling layer;
    a structure blocking layer disposed over the second pinning layer;

a magnetic reference layer disposed over the structure blocking layer;

a tunnel barrier layer disposed over the magnetic reference layer;

a magnetic storage layer disposed over the tunnel barrier layer;

a capping layer disposed over the magnetic storage layer, wherein the capping layer comprises one or more layers; and a hard mask disposed over the capping layer, wherein at least one of the capping layer, the buffer layer, and the SyF coupling layer is not fabricated from Ru.

15. The film stack of claim 14, wherein the capping layer comprises:

an Ir containing layer as a top layer.

16. The film stack of claim 15, wherein the capping layer further comprises:

one or more of a W containing layer, an oxygen containing layer, a second Ir containing layer disposed directly above the oxygen containing layer, a CoFeB containing layer, a Ta containing layer, and a Mo containing layer.

17. The film stack of claim 14, wherein the buffer layer further comprises one or more of a TaN containing layer and a Ta containing layer; and the seed layer comprises (a) a NiCr containing layer or (b) one or more of a Pt containing layer, an Ir containing layer, and a Ru containing layer.

18. A film stack utilized to form a magnetic tunnel junction (MTJ) structure on a substrate, comprising:

a buffer layer, wherein the buffer layer comprises a CoFeB containing layer, wherein a wt % of boron is greater than about 20%;

a seed layer disposed over the buffer layer;

a first pinning layer disposed over the seed layer;

a synthetic ferrimagnet (SyF) coupling layer disposed over the first pinning layer, wherein the SyF coupling layer comprises an Ir containing layer;

a second pinning layer disposed over the SyF coupling layer;

a structure blocking layer disposed over the second pinning layer;

a magnetic reference layer disposed over the structure blocking layer;

a tunnel barrier layer disposed over the magnetic reference layer;

a magnetic storage layer disposed over the tunnel barrier layer;

a capping layer disposed over the magnetic storage layer, wherein the capping layer comprises one or more layers, and a top layer of the capping layer is an Ir containing layer; and a hard mask disposed over the capping layer, wherein at least one of the capping layer, the buffer layer, and the SyF coupling layer is not fabricated from Ru.

19. The film stack of claim 18, wherein the seed layer comprises a NiCr containing layer; and the buffer layer further comprises one or more of a Ta containing layer and a TaN containing layer, wherein the CoFeB containing layer of the buffer layer is disposed over one or more of the Ta containing layer of the buffer layer and a TaN containing layer of the buffer layer.

20. The film stack of claim 18, wherein the seed layer comprises one or more of a Pt containing layer, an Ir containing layer, and a Ru containing layer; and the buffer layer further comprises one or more of a Ta containing layer and a TaN containing layer, wherein the one or more of the Ta containing layer of the buffer layer and a TaN containing layer of the buffer layer is disposed over the CoFeB containing layer of the buffer layer.

* * * * *